United States Patent
Cai et al.

(10) Patent No.: US 8,557,670 B1
(45) Date of Patent: Oct. 15, 2013

(54) SOI LATERAL BIPOLAR JUNCTION TRANSISTOR HAVING A WIDE BAND GAP EMITTER CONTACT

(75) Inventors: Jin Cai, Cortlandt Manor, NY (US);
Kevin K. Chan, Staten Island, NY (US);
Christopher P. D'Emic, Ossining, NY (US); Tak H. Ning, Yorktown Heights, NY (US); Dae-Gyu Park, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/605,253

(22) Filed: Sep. 6, 2012

Related U.S. Application Data

(63) Continuation of application No. 13/433,537, filed on Mar. 29, 2012.

(51) Int. Cl.
*H01L 21/8222* (2006.01)

(52) U.S. Cl.
USPC ........... 438/316; 438/300; 438/311; 438/312; 438/317; 257/19; 257/197; 257/198; 257/616; 257/E21.372; 257/E21.373

(58) Field of Classification Search
USPC ............ 257/19, 197, 198, 616, E21.371, 257/E21.372, E21.373; 438/300, 311, 312, 438/316, 317
See application file for complete search history.

(56) References Cited

U.S. PATENT DOCUMENTS

| | | | |
|---|---|---|---|
| 4,768,074 A * | 8/1988 | Yoshida et al. | 257/198 |
| 5,451,798 A | 9/1995 | Tsuda et al. | |
| 5,952,706 A * | 9/1999 | Bashir | 257/587 |
| 6,492,711 B1 * | 12/2002 | Takagi et al. | 257/593 |

(Continued)

FOREIGN PATENT DOCUMENTS

EP 810646 A3 1/1998

OTHER PUBLICATIONS

Kumar, M.J., et al., "Realising wide bandgap P-SiC-emitter lateral heterojunction bipolar transistors with low collector-emitter offset voltage and high current gain: a novel proposal using numerical simulation", IEE Proceedings-Circuits, Devices, and Systems (Oct. 2004), vol. 151, No. 5, pp. 399-405.*

(Continued)

*Primary Examiner* — Bac Au
*Assistant Examiner* — Victor Barzykin
(74) *Attorney, Agent, or Firm* — Scully, Scott, Murphy & Presser, P.C.; Louis J. Percello, Esq.

(57) ABSTRACT

A lateral heterojunction bipolar transistor is formed on a semiconductor-on-insulator substrate including a top semiconductor portion of a first semiconductor material having a first band gap and a doping of a first conductivity type. A stack of an extrinsic base and a base cap is formed such that the stack straddles over the top semiconductor portion. A dielectric spacer is formed around the stack. Ion implantation of dopants of a second conductivity type is performed to dope regions of the top semiconductor portion that are not masked by the stack and the dielectric spacer, thereby forming an emitter region and a collector region. A second semiconductor material having a second band gap greater than the first band gap and having a doping of the second conductivity type is selectively deposited on the emitter region and the collector region to form an emitter contact region and a collector contact region, respectively.

20 Claims, 11 Drawing Sheets

(56) References Cited

U.S. PATENT DOCUMENTS

| | | | |
|---|---|---|---|
| 6,756,278 B2 | 6/2004 | Yuki et al. | |
| 6,885,042 B2 | 4/2005 | Yanagisawa et al. | |
| 7,465,969 B2 * | 12/2008 | Ohnishi et al. | 257/198 |
| 7,476,914 B2 | 1/2009 | Dokumaci et al. | |
| 2006/0060941 A1 * | 3/2006 | Sun et al. | 257/557 |
| 2010/0013458 A1 | 1/2010 | Lany et al. | |
| 2012/0235151 A1 * | 9/2012 | Cai et al. | 257/65 |
| 2012/0289018 A1 * | 11/2012 | Ning et al. | 438/311 |
| 2012/0313216 A1 * | 12/2012 | Cai et al. | 257/526 |
| 2012/0314485 A1 * | 12/2012 | Cai et al. | 365/156 |

OTHER PUBLICATIONS

Shahidi, G.G., et al., "A novel high-performance lateral bipolar on SOI", pp. 663-666, 1991, Electron Devices Meeting, 1991. IEDM '91. Technical Digest., International.*

Cai, J., et al., "Complementary thin-base symmetric lateral bipolar transistors on SOI", pp. 16.3.1-16.3.4 (Dec. 2011), Electron Devices Meeting (IEDM), 2011 IEEE International.*

Yamada, T., et al., "A novel high-performance lateral BJT on SOI with metal-backed single-silicon external base for low-power/low-cost RF applications", pp. 129-132, Proceedings of the 1999 Bipolar/BiCMOS Circuits and Technology Meeting, 1999.*

Kumar, M.J. et al., "Realizing High Current Gain PNP Transistors Using a Novel Surface Accumulation Layer Transistor (SALTran) Concept" IEE Proceedings-Circuits, Devices and Systems (Mar. 2005) pp. 178-182, vol. 152, No. 2.

U.S. Appl. No. 13/048,366, filed Mar. 15, 2011, entitled "Vertical Polysilicon-Germanium Heterojunction Bipolar Transistor".

U.S. Appl. No. 13/048,342, filed Mar. 15, 2011, entitled "Horizontal Polysilicon-Germanium Heterojunction Bipolar Transistor".

U.S. Appl. No. 12/958,647, filed Dec. 2, 2010, entitled "SOI SiGe-Base Lateral Bipolar Junction Transistor".

* cited by examiner

SOI LATERAL BIPOLAR JUNCTION TRANSISTOR HAVING A WIDE BAND GAP EMITTER CONTACT

CROSS REFERENCE TO RELATED APPLICATION

This application is a continuation of U.S. patent application Ser. No. 13/433,537, filed Mar. 29, 2012 the entire content and disclosure of which is incorporated herein by reference.

BACKGROUND

The present disclosure relates to a lateral bipolar transistor (BJT) structure, and particularly to a lateral bipolar junction transistor including a wide band gap emitter contact and methods of manufacturing the same.

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

While the increase in the current gain obtained by an HBT is desirable, the heterojunction between two semiconductor materials having different band gaps results in a lattice mismatch at the heterojunction. Dislocations are formed in the vicinity of the heterojunction to relieve the stress generated by the lattice mismatch. However, the dislocations in the vicinity of the p-n junction function as scattering centers for charge carriers, reducing the current flow between the emitter and the base. The dislocations may also act as generation and recombination centers, causing an undesirable increase in p-n junction leakage current. Thus, HBTs known in the art suffer from the deleterious effect of the dislocation centers around the p-n junction despite the advantageous effect of providing a relatively high current gain through formation of the heterojunction between the emitter and the base.

SUMMARY

A lateral heterojunction bipolar transistor (HBT) is formed on a semiconductor-on-insulator substrate including a top semiconductor portion of a first semiconductor material having a first band gap and a doping of a first conductivity type. A stack of an extrinsic base and a base cap is formed such that the stack straddles over the top semiconductor portion. A dielectric spacer is formed around the stack. Ion implantation of dopants of a second conductivity type is performed to dope regions of the top semiconductor portion that are not masked by the stack and the dielectric spacer, thereby forming an emitter region and a collector region. The region of the top semiconductor portion between the emitter region and the collector region constitutes a base region. A second semiconductor material having a second band gap greater than the first band gap and having a doping of the second conductivity type is selectively deposited on the emitter region and the collector region to form an emitter contact region and a collector contact region, respectively. The heterojunction between the emitter region and the emitter contact region increases the current gain relative to bipolar transistors without a heterojunction, while dislocations are minimized around the p-n junction between the emitter region and the base region.

According to an aspect of the present disclosure, a semiconductor structure including a bipolar junction transistor (BJT) is provided. The BJT includes: a base region including a first portion of a first semiconductor material having a first band gap and having a doping of a first conductivity type; an emitter region including a second portion of the first semiconductor material, having a doping of a second conductivity type that is the opposite of the first conductivity type, and laterally contacting the base region; and an emitter contact region including a portion of a second semiconductor material having a second band gap that is greater than said first band gap, having a doping of the second conductivity type, and contacting the emitter region.

According to another aspect of the present disclosure, a method of forming a semiconductor structure including a bipolar junction transistor (BJT) is provided. The method includes: providing a substrate including a semiconductor portion including a first semiconductor material having a first band gap and having a doping of a first conductivity type; converting a region of the semiconductor portion into an emitter region by introducing dopants of a second conductivity type that is the opposite of the first conductivity type into the region of the semiconductor portion, wherein a remaining region of the semiconductor portion constitutes a base region that laterally contacts the emitter region; and depositing an emitter contact region including a portion of a second semiconductor material having a second band gap that is greater than the first band gap and having a doping of the second conductivity type directly on the emitter region.

DETAILED DESCRIPTION

Figure 1:
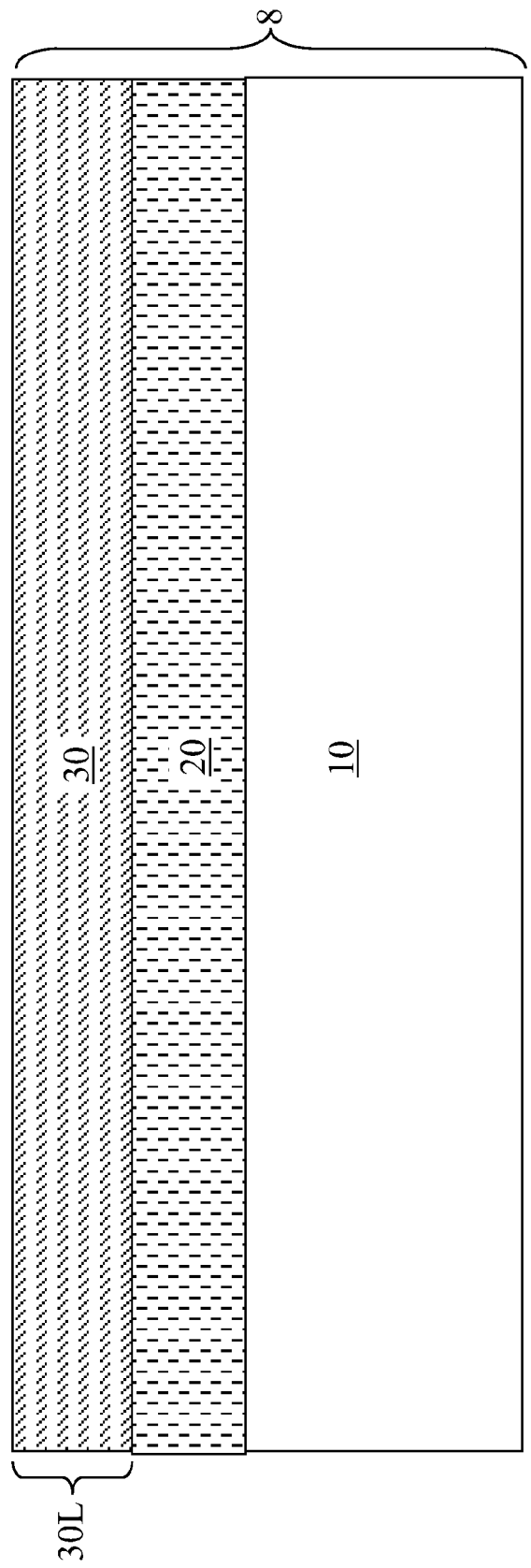
FIG. 1 is a vertical cross-sectional view of an exemplary semiconductor structure after providing a semiconductor-on-insulator (SOI) substrate according to an embodiment of the present disclosure.

As stated above, the present disclosure relates to a lateral bipolar junction transistor including a wide band gap emitter contact and methods of manufacturing the same, which are now described in detail with accompanying figures. It is noted that like and corresponding elements mentioned herein and illustrated in the drawings are referred to by like reference numerals.

Referring to FIG. 1, an exemplary semiconductor structure according to an embodiment of the present disclosure includes a substrate 8. The substrate 8 as provided includes at least a stack of a semiconductor layer and an insulator layer. For example, the substrate 8 can be a semiconductor-on-insulator (SOI) substrate including a stack, from bottom to top, a handle substrate 10, a buried insulator layer 20 contacting a top surface of the handle substrate 10, and a top semiconductor layer 30L contacting the top surface of the buried insulator layer 20. The top semiconductor layer 30L as provided can include a semiconductor material that extends across the entirety of the buried insulator layer 20.

The handle substrate 10 can include a semiconductor material, an insulator material, a conductor material, or a combination thereof. In one example, the handle substrate 10 can include a semiconductor material such as silicon. If the handle substrate 10 includes a semiconductor material, the handle substrate 10 can be undoped or have a p-type doping or an n-type doping.

The buried insulator layer 20 includes a dielectric material such as silicon oxide and/or silicon nitride. For example, the buried insulator layer 20 can include thermal silicon oxide. The thickness of the buried insulator layer 20 can be from 5 nm to 1000 nm, and typically from 100 nm to 200 nm, although lesser and greater thicknesses can also be employed. The buried insulator layer 20 may, or may not, include multiple dielectric layers, e.g., a stack including at least a silicon oxide layer and a silicon nitride layer.

The top semiconductor layer 30L as provided in the SOI substrate can be a planar semiconductor material layer 30 having a thickness from 5 nm to 1,000 nm. The semiconductor material in the planar semiconductor material layer 30 is herein referred to as a first semiconductor material. The first semiconductor material has a first band gap and has a doping of a first conductivity type. The first semiconductor material can be any semiconductor material known in the art provided that another semiconductor material having a greater band gap than the first semiconductor material exists. The first semiconductor material can be selected from Group IV elemental semiconductors, Group IV compound semiconductors, III-V semiconductors, II-VI semiconductors, I-VII semiconductors, IV-VI semiconductors, IV-VI semiconductors, V-VI semiconductors, II-V semiconductors, semiconducting oxides, layered semiconductors, magnetic semiconductors, organic semiconductors, semiconducting charge-transfer complexes, semiconducting alloys thereof, or a combination thereof. The first semiconductor material can be, for example, crystalline carbon, silicon, germanium, a silicon germanium alloy, silicon carbide, aluminium antimonide, aluminium arsenide, aluminium nitride, aluminium phosphide, boron nitride, boron phosphide, boron arsenide, gallium antimonide, gallium arsenide, gallium nitride, gallium phosphide, indium antimonide, indium arsenide, indium nitride, indium phosphide, aluminium gallium arsenide, indium gallium arsenide, indium gallium phosphide, aluminium indium arsenide, aluminium indium antimonide, gallium arsenide nitride, gallium arsenide phosphide, gallium arsenide antimonide, aluminium gallium nitride, aluminium gallium phosphide, indium gallium nitride, indium arsenide antimonide, indium gallium antimonide, aluminium gallium indium phosphide, aluminium gallium arsenide phosphide, indium gallium arsenide phosphide, indium gallium arsenide antimonide, indium arsenide antimonide phosphide, aluminium indium arsenide phosphide, aluminium gallium arsenide nitride, indium gallium arsenide nitride, indium aluminium arsenide nitride, gallium arsenide antimonide nitride, gallium indium nitride arsenide antimonide, gallium indium arsenide antimonide phosphide, cadmium selenide, cadmium sulfide, cadmium telluride, zinc oxide, zinc selenide, zinc sulfide, zinc telluride, cadmium zinc telluride, mercury cadmium telluride, mercury zinc telluride, mercury zinc selenide, cuprous chloride, copper sulfide, lead selenide, lead telluride, tin sulfide, tin telluride, lead tin telluride, thallium tin telluride, thallium germanium telluride, bismuth telluride, cadmium phosphide, cadmium arsenide, cadmium antimonide, zinc phosphide, zinc arsenide, zinc antimonide, titanium dioxide, copper oxide, uranium dioxide, uranium trioxide, bismuth trioxide, tin dioxide, barium titanate, strontium titanate, lithium niobate, lanthanum copper oxide, lead iodide, molybdenum disulfide, gallium selenide, tin sulfide, bismuth sulfide, gallium manganese arsenide, indium manganese arsenide, cadmium manganese telluride, lead manganese telluride, lanthanum calcium manganate, iron oxide, nickel oxide, europium oxide, europium sulfide, chromium bromide, copper indium gallium selenide, copper zinc tin sulfide, copper indium selenide, silver gallium sulfide, zinc silicon phosphide, arsenic selenide, platinum silicide, bismuth iodide, mercury iodide, thallium bromide, selenium, silver sulfide, an alloy thereof, or a stack thereof, provided that another semiconductor material having a greater band gap than the selected first semiconductor material exists.

In one embodiment, the first semiconductor material can be a single crystalline semiconductor material. In another embodiment, the first semiconductor material can be germanium or a silicon germanium alloy. In yet another embodiment, the first semiconductor material can be single crystalline germanium or a single crystalline silicon germanium alloy. In still another embodiment, the first semiconductor material can be a polycrystalline material or an amorphous material.

The first semiconductor material has a doping of a first conductivity type, i.e., doped with electrical dopants of the first conductivity type. The first conductivity type can be p-type or n-type. If the first conductivity type is p-type, the electrical dopants can be, for example, B, Al, Ga, In, and/or Tl. If the first conductivity type is n-type, the electrical dopants can be, for example, P, As, and/or Sb. The dopant concentration in the first semiconductor material can be from $1.0 \times 10^{15}/cm^3$ to $3.0 \times 10^{19}/cm^3$, although lesser and greater dopant concentrations can also be employed.

Figure 2:
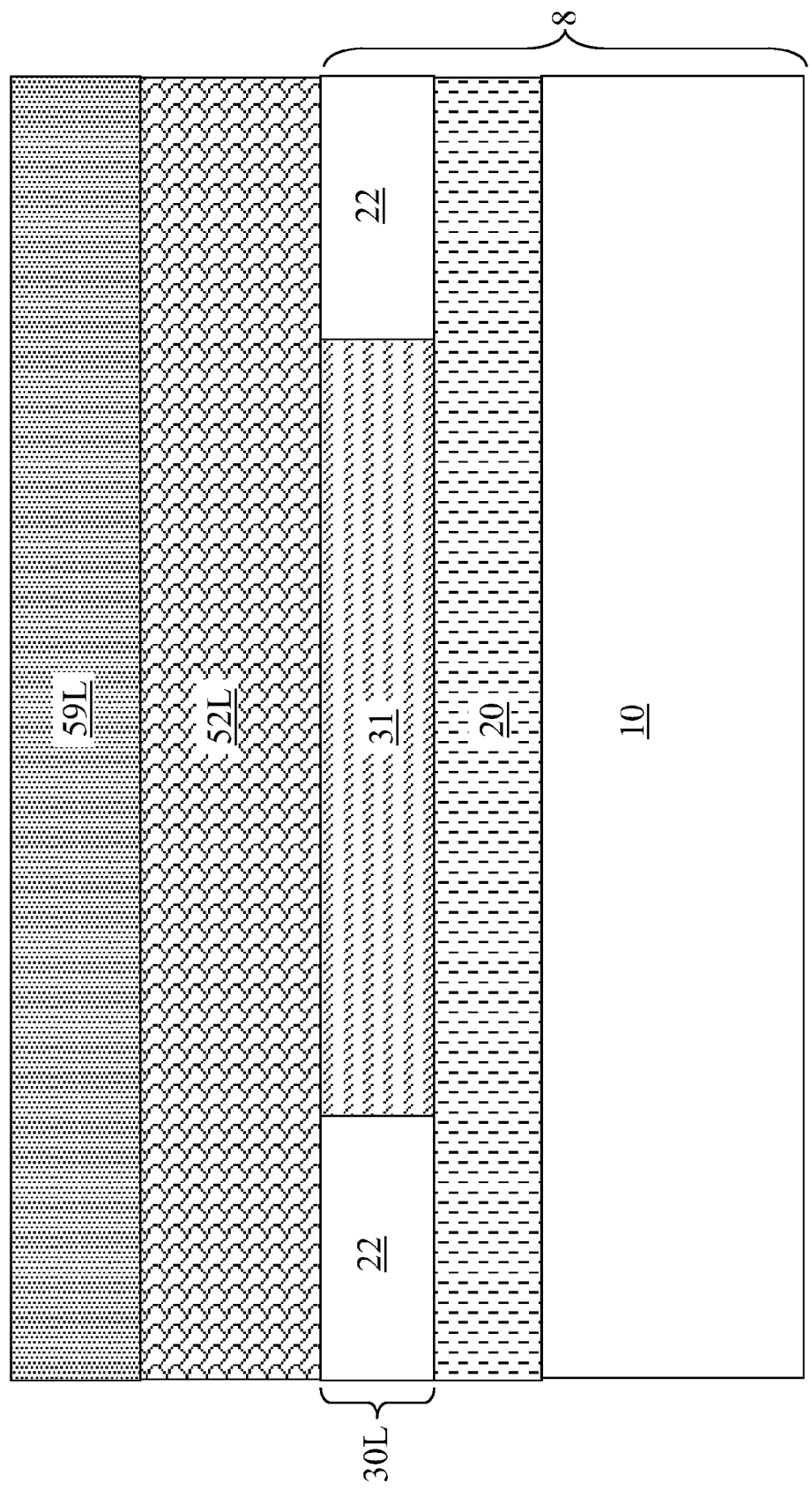
FIG. 2 is a vertical cross-sectional view of the exemplary semiconductor structure after deposition of an extrinsic base layer and a base cap layer according to an embodiment of the present disclosure.

Referring to FIG. 2, at least one shallow trench extending at least to the top surface of the buried insulator layer 20 is formed through the planar semiconductor material layer 30, and is subsequently filled with a dielectric material such as silicon oxide, silicon nitride, and/or silicon oxynitride. The at least one shallow trench can be formed to laterally enclose an unetched region of the planar semiconductor material layer 30, which is herein referred to as a top semiconductor portion 31. Thus, the top semiconductor portion 31 is formed by patterning the top semiconductor layer 30L as provided with a shallow trench that extends at least to the top surface of the buried insulator layer 20. A remaining portion of the top semiconductor layer 30L is the top semiconductor portion 31.

The top semiconductor portion 31 is a semiconductor portion that is present within the top semiconductor layer 30L. Excess portions of the dielectric material is removed from above the top surface of the top semiconductor portion 31, for example, by a recess etch or chemical mechanical planarization (CMP). A remaining portion of the dielectric material that fills the at least one shallow trench constitutes at least one shallow trench isolation structure 22. One of the at least one shallow trench isolation structure laterally encloses, and contacts all sidewalls of, the top semiconductor portion 31 illustrated in FIG. 2. The top surface(s) of the at least one shallow trench isolation structure 22 can be substantially coplanar with, raised above, or recessed below, the top surface of the top semiconductor portion 31. As used herein, a first surface is "substantially coplanar" with a second surface if the offset between the first surface and the second surface is does not exceed inherent height variations in the first surface or the second surface that are introduced during currently available manufacturing processes.

An extrinsic base layer 52L and a base cap layer 59L are sequentially deposited over the top semiconductor layer 30L. The extrinsic base layer 52L can be a doped semiconductor material layer having a doping of the first conductivity type. The doped semiconductor material of the extrinsic base layer 52L is herein referred to as an extrinsic base semiconductor material. In one embodiment, the extrinsic base layer 52L includes a different semiconductor material than the top semiconductor portion 31. In another embodiment, the extrinsic base layer 52L includes a same semiconductor material as the top semiconductor portion 31. In one embodiment, the extrinsic base layer 52L can be polycrystalline or amorphous as deposited. In another embodiment, the top semiconductor portion 31 can be single crystalline, and the extrinsic base layer 52L can be epitaxially aligned to the top semiconductor portion 31, and correspondingly, single crystalline.

The extrinsic base layer 52L has a doping of the first conductivity type. The extrinsic base layer 52L can be in-situ doped during deposition, or can be deposited as an intrinsic semiconductor material layer and subsequently doped by ion implantation, gas phase doping, plasma doping, or diffusion of electrical dopants from a disposable dopant source layer (such as a phosphosilicate glass layer, a borosilicate glass layer, or an arsenosilicate glass layer). In one embodiment, the extrinsic base layer 52L includes dopants of the first conductivity type at a greater dopant concentration than the concentration of dopants of the first conductivity type within the top semiconductor portion 31. For example, the extrinsic base layer 52L includes dopants of the first conductivity type at a dopant concentration from $1.0 \times 10^{18}/cm^3$ to $3.0 \times 10^{21}/cm^3$, although lesser and greater dopant concentrations can also be employed. In one embodiment, the extrinsic base layer 52L can include a doped polycrystalline material having a doping of the first conductivity type. The extrinsic base layer 52L can be deposited, for example, by chemical vapor deposition (CVD) or physical vapor deposition (PVD). The thickness of the extrinsic base layer 52L can be from 10 nm to 1,000 nm, although lesser and greater thicknesses can also be employed.

The base cap layer 59L includes a dielectric material such as silicon oxide, silicon nitride, silicon oxynitride, a dielectric metal oxide, or a combination thereof. The base cap layer 59L can be deposited, for example, by chemical vapor deposition (CVD). The thickness of the base cap layer 59L can be from 10 nm to 1,000 nm, although lesser and greater thicknesses can also be employed. In one embodiment, the thickness of the base cap layer 59L can be selected to have the same stopping power as, or a greater stopping power than, the top semiconductor portion 31 for ion implantation, to be subsequently performed, of dopants of a second conductivity type that is the opposite of the first conductivity type. In one embodiment, a dielectric material different from the dielectric materials of the at least one shallow trench isolation structure 22 is employed for the base cap layer 59 so that the material of the base cap layer 59L can be subsequently removed selective to the material of the at least one shallow trench isolation structure 22.

Figure 3:
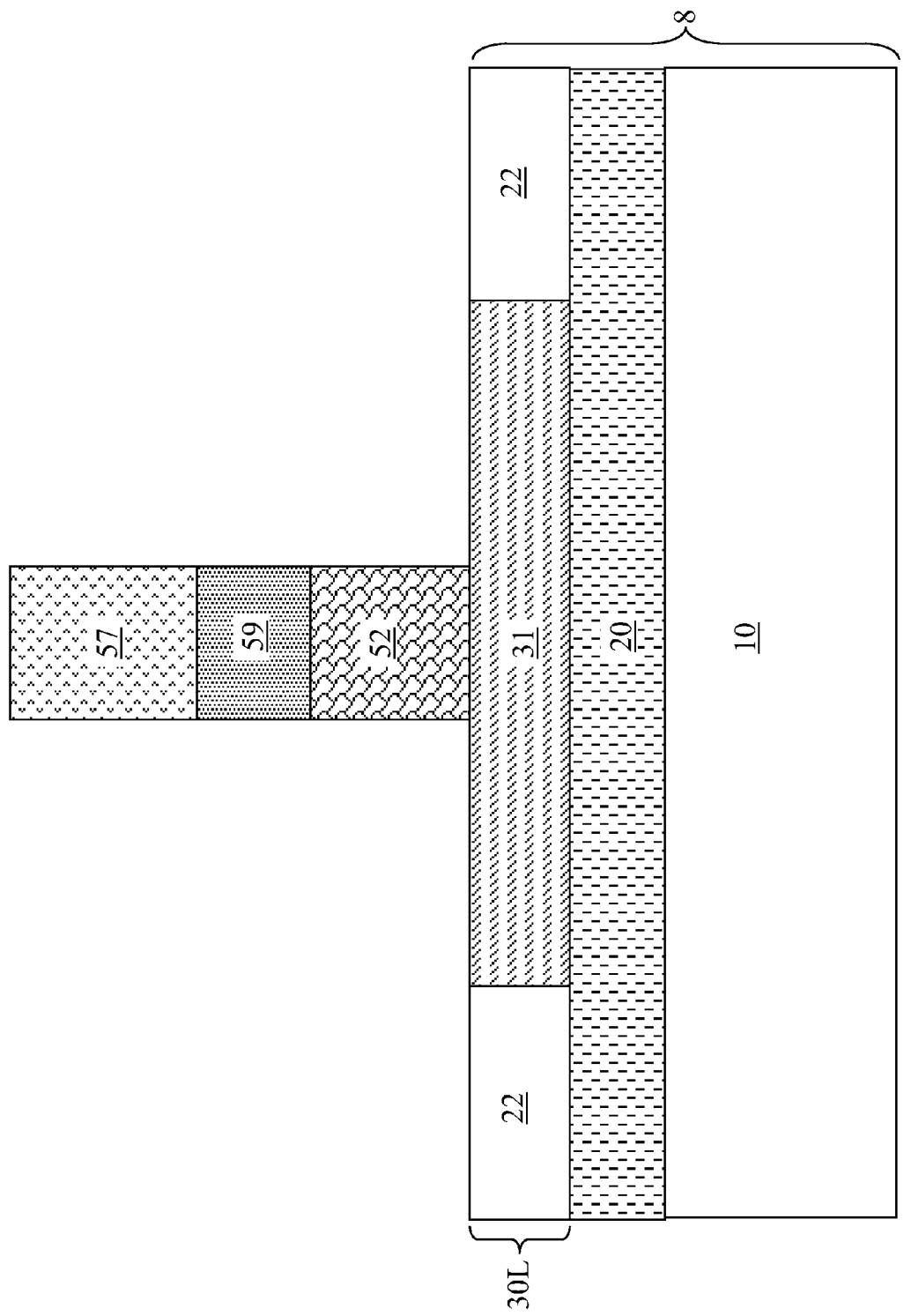
FIG. 3 is a vertical cross-sectional view of the exemplary semiconductor structure after patterning of the base cap layer and the extrinsic base layer according to an embodiment of the present disclosure.

Referring to FIG. 3, the stack of the base cap layer 59L and the extrinsic base layer 52L is patterned, for example, by applying and lithographically patterning a photoresist layer 57 and transferring the pattern in the patterned photoresist layer 57 through the stack of the base cap layer 59L and the extrinsic base layer 52L. A remaining portion of the base cap layer 59L is herein referred to as a base cap 59, and a remaining portion of the extrinsic base layer 52L is herein referred to as an extrinsic base region 52. The transfer of the pattern from the patterned photoresist layer 57 to the stack of the base cap layer 59L and the extrinsic base layer 52L can be effected by an anisotropic etch, in which case the sidewalls of the extrinsic base region 52 is vertically coincident (coincident in a top-down view) with sidewalls of the base cap 59.

The horizontal cross-sectional shape of the base cap 59 and the extrinsic base region 52 is selected such that the stack of the extrinsic base region 52 and the base cap 59 straddles over a middle portion of the top semiconductor portion 31. The stack of the extrinsic base region 52 and the base cap 59 can extend across the top semiconductor portion 31 and two end portions of the stack of the extrinsic base region 52 and the base cap 59 can overlie the at least one shallow trench isolation structure 22. Thus, the top surface of a first peripheral portion of the top semiconductor portion 31 is physically exposed on one side of the stack of the extrinsic base region 52 and the base cap 59, and the top surface of a second peripheral portion of the top semiconductor portion 31 is physically exposed on another side of the stack of the extrinsic base region 52 and the base cap 59 after formation of the stack of the extrinsic base region 52 and the base cap 59.

The endpointing of the anisotropic etch that forms the stack of the extrinsic base region 52 and the base cap 59 can be effected by detecting physical exposure of the top surface of the at least one shallow trench isolation structure 22 through optical means or through detection of change of radical composition in the plasma of the anisotropic etch. Alternately or additionally, if the first semiconductor material is different from the extrinsic base semiconductor material, the endpointing of the anisotropic etch can be effected by detecting physical exposure of the top surface of the top semiconductor portion 31 through optical means or through detection of change of radical composition in the plasma of the anisotropic etch. Yet alternately or additionally, if there exists an interfacial layer such as a native oxide layer (having a thickness on the order of one atomic layer of a semiconductor oxide) at the interface between the top semiconductor portion 31 and the extrinsic base layer 52, an etch chemistry that is highly selective to a semiconductor oxide can be employed to minimize an overetch into the top semiconductor portion 31.

In one embodiment, physically exposed surfaces of the top semiconductor portion 31 after the anisotropic etch can be substantially coplanar with the interface between the top semiconductor portion 31 and the extrinsic base region 52. In another embodiment, physically exposed surfaces of the top semiconductor portion 31 after the anisotropic etch can be recessed relative to the interface between the top semiconductor portion 31 and the extrinsic base region 52. While the present disclosure is described employing an anisotropic etch, an embodiment in which an isotropic etch such as a wet etch is employed to transfer the pattern in the patterned photoresist layer 57 through the stack of the extrinsic base region 52 and the base cap 59 is also contemplated. Use of an isotropic etch may be suitable if the lateral dimension of the extrinsic base region 52 is not critical for the purposes of application of a bipolar junction transistor to be formed. The patterned photoresist layer 57 is subsequently removed, for example, by ashing. The extrinsic base region 52 includes the extrinsic base semiconductor material, has a doping of the first conductivity type, and provides an electrical contact to the portion of the top semiconductor portion that is in contact with the extrinsic base region 52.

Figure 4:
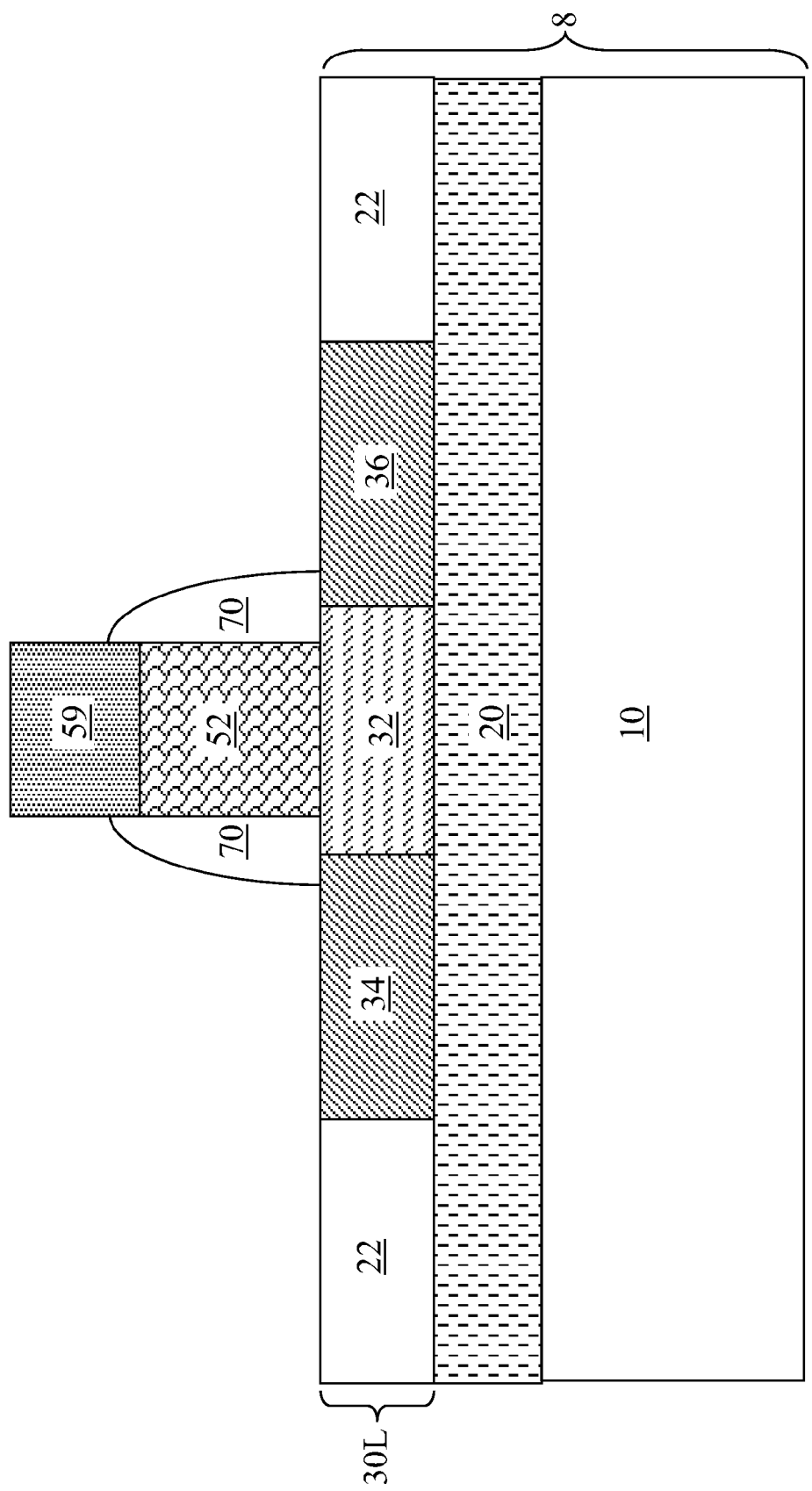
FIG. 4 is a vertical cross-sectional view of the exemplary semiconductor structure after formation of a dielectric spacer according to an embodiment of the present disclosure.

Referring to FIG. 4, a dielectric spacer 70 is formed on sidewalls of the extrinsic base region 52 and on top surfaces of regions of the top semiconductor portion 31 (See FIG. 3) that are proximal to the sidewalls of the extrinsic base region 52. The dielectric spacer 70 includes a dielectric material such as silicon oxide, silicon nitride, silicon oxynitride, organosilicate glass, or any dielectric material that can be employed to form a spacer as known in the art. In one embodiment, the material of the dielectric spacer 70 is selected to be different from the dielectric material of the base cap 59 so that the material of the base cap 59 can be subsequently removed selective to the material of the dielectric spacer 70. In another embodiment, the material of the dielectric spacer 70 is selected to be different from the dielectric material of the at least one shallow trench isolation structure 22 to minimize overetching into the shallow trench structure 22 when the dielectric spacer 70 is formed.

The dielectric spacer 70 can be formed, for example, by conformal deposition of a dielectric material layer and subsequent anisotropic etch that removes the horizontal portions of the deposited dielectric material layer. The conformal deposition of the dielectric material layer can be performed, for example, by chemical vapor deposition (CVD), atomic layer deposition (ALD), or a combination thereof. The thickness of the dielectric spacer 70, as measured at the base that contact the top semiconductor portion 31, can be from 10 nm to 300 nm, although lesser and greater thicknesses can also be employed. The dielectric spacer 70 is of unitary construction (in a single piece), and laterally contacts the sidewalls of the extrinsic base region 52 and the base cap 59. In one embodiment, the dielectric spacer 70 can include two layers, a first dielectric layer that is in contact with the sidewalls of the extrinsic base region 52 and the top surface of the regions of the top semiconductor portion 31 that are proximal to the sidewalls of the extrinsic base region 52, and a second dielectric layer that lies on top of the first dielectric layer.

Dopants of the second conductivity type are introduced into regions of the top semiconductor portion 31 that are not covered by the dielectric spacer 70 and the stack of the extrinsic base region 52 and the base cap 59. The second conductivity type is the opposite of the first conductivity type. If the first conductivity type is p-type, the second conductivity type is n-type, and vice versa. The dopants of the second conductivity type can be introduced, for example, by ion implantation employing the combination of the dielectric spacer 70 and the stack of the extrinsic base region 52 and the base cap 59 as an implantation mask. An additional implantation mask (not shown) such as a patterned photoresist layer can also be employed if multiple devices (not shown) are present on the substrate 8.

Introduction of the dopants of the second conductivity type converts a first region of the semiconductor portion 31 into an emitter region 34 and a second region of the semiconductor portion 31 into a collector region 36. A remaining unimplanted region of the semiconductor portion 31 constitutes a base region 32 that laterally contacts the emitter region 34 and the collector region 36. The conversion of two regions of the top semiconductor portion 31 into the emitter region 34 and the collector region 36, respectively, is performed simultaneously. Each of the emitter region 34 and the collector region 36 laterally contacts the base region 32 upon formation.

The base region 32 includes a first portion of the first semiconductor material, has the first band gap, and has a doping of the first conductivity type. The emitter region 34 includes a second portion of the first semiconductor material, has a doping of the second conductivity type that is the opposite of the first conductivity type, and laterally contacts the base region 32. The collector region 36 includes a third portion of the first semiconductor material, has a doping of the second conductivity type, laterally contacts the base region 32, and is spaced from the emitter region 34 by the base region 32. In one embodiment, the emitter region 34 and the collector region 36 can have a same dopant concentration of dopants of the second conductivity type. The net dopant concentration of dopants of the second conductivity type, i.e., the concentration of the dopants of the second conductivity type less the concentration of dopants of the first conductivity type, in the emitter region 34 and the collector region 36 can be, for example, from $1.0 \times 10^{17}/cm^3$ to $3.0 \times 10^{20}/cm^3$, although lesser and greater dopant concentrations can also be employed. In another embodiment, a masking layer (not shown) can be employed to provide asymmetric net dopant concentration of dopants of the second conductivity type across the emitter region 34 and the collector region 36.

The location of the boundary between the base region 32 and the emitter region 34 and the location of the boundary between the base region 32 and the collector region 36 is determined by the location of the outer sidewall of the dielectric spacer 70, the lateral straggle of implanted ions of the second conductivity type, and the subsequent diffusion of the implanted ions. If the ion implantation is performed along a surface normal of the top semiconductor portion 31, the lateral offset of the boundary between the base region 32 and the emitter region 34 from the bottommost portion of the outer sidewall of the dielectric spacer 70 over the emitter region 34 can be the same as the lateral offset of the boundary between the base region 32 and the collector region 36 from the bottommost portion of the outer sidewall of the dielectric spacer 70 over the collector region 36. In one embodiment, if the base cap layer 59L has the same stopping power as, or a greater stopping power than, the top semiconductor portion 31 for ion implantation of dopants of the second conductivity type, the energy of the ion implantation can be selected such that dopants of the second conductivity type reaches the bottommost region of the top semiconductor portion 31, while not penetrating into the extrinsic base region 52.

The bottom surface of the dielectric spacer 70 is in contact with a peripheral portion of the top surface of the emitter region 34, a peripheral portion of the top surface of the collector region 36, and two disjoined peripheral portions of the top surface of the base region 32. In one embodiment, the entirety of the interface between the base region 32 and the extrinsic base region 52 can be substantially coplanar with the entirety of the top surface of the emitter region 34 and the entirety of the top surface of the collector region 36. The buried insulator layer 20 has a planar top surface that contacts the base region 32, the emitter region 34, and the collector region 36.

Figure 5:
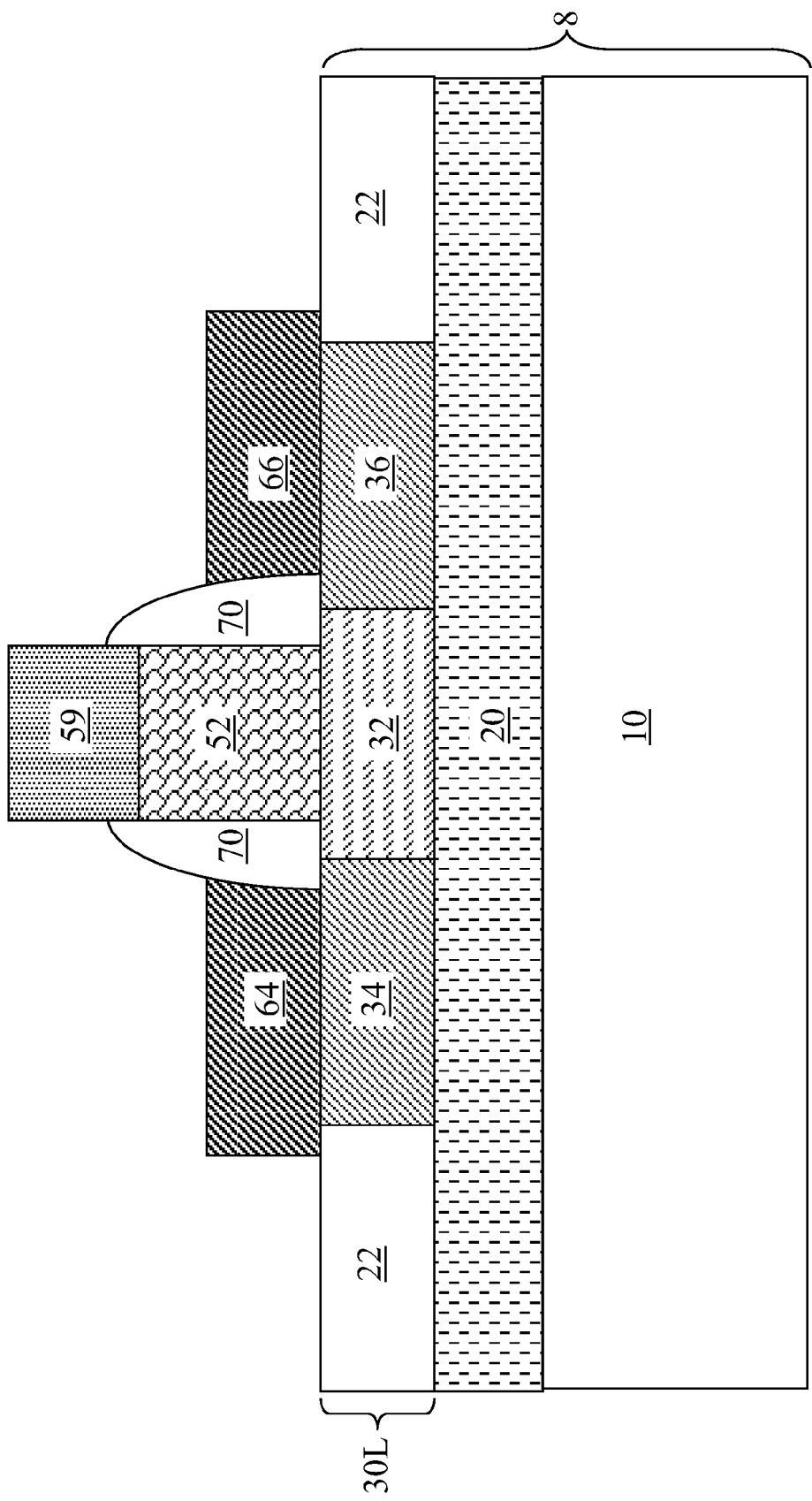
FIG. 5 is a vertical cross-sectional view of the exemplary semiconductor structure after selective deposition of an emitter contact region and a collector contact region according to an embodiment of the present disclosure.

Referring to FIG. 5, a second semiconductor material having a second band gap that is greater than the first band gap is selectively deposited on the semiconductor surfaces of the emitter region 34 and the collector region 36, while not growing from dielectric surfaces of the exemplary structure. The second semiconductor material can be any semiconductor material such as the specifically listed semiconductor material for the first semiconductor material or any other semiconductor material known in the art, provided that the second band gap of the second semiconductor material is greater than the first band gap of the first semiconductor material.

The second semiconductor material is deposited employing a selective deposition process, in which the second semiconductor material grows from semiconductor surfaces and does not grow from dielectric surfaces. The second semiconductor material that grows on, and from, the emitter region 34 constitutes an emitter contact region 64, and the second semiconductor material that grows on, and from, the collector region 36 constitutes a collector contact region 66. In other words, the second semiconductor material is selectively deposited on the physically exposed surface of the emitter region 34 and the physically exposed surface of the collector region 36, while the second semiconductor material does not grow from surfaces of the dielectric spacer 70, the base cap 59, or the shallow trench isolation structure 22.

As the emitter contact region 64 grows with continued deposition of the second semiconductor material during the selective deposition process, the emitter contact region 64 comes into contact with a lower portion of an outer sidewall of the dielectric spacer 70 and a peripheral top surface of the shallow trench isolation structure 22. Likewise, as the collector contact region 66 grows with continued deposition of the second semiconductor material during the selective deposition process, the collector contact region 66 comes into contact with a lower portion of another outer sidewall of the dielectric spacer 70 and another peripheral top surface of the shallow trench isolation structure 22. The thickness of the emitter contact region 64 and the collector contact region 66 is less than the height of the dielectric spacer 70, and can be from 1 nm to 1,000 nm, although lesser and greater thicknesses can also be employed.

During the selective deposition process, at least one semiconductor precursor gas and at least one etchant gas are flowed into a process chamber to deposit the second semiconductor material on physically exposed semiconductor surfaces of the emitter region 34 and the collector region 36. The at least one semiconductor precursor gas and the at least one etchant gas can be any combination that enable selective deposition of the second semiconductor material as known in the art. Non-limiting examples of the at least one semiconductor precursor gas include $SiH_4$, $SiH_2Cl_2$, $SiHCl_3$, $SiCl_4$, $Si_2H_6$, $GeH_4$, $Ge_2H_6$, and other precursor gases for depositing the selected second semiconductor material. Non-limiting examples of the at least one etchant gas include HCl.

In one embodiment, the emitter contact region 64 and the collector contact region 66 can be doped in-situ during the selective deposition of the second semiconductor material. Formation of the emitter contact region 64 and the collector contact region 66 with in-situ doping can be effected by flowing a dopant gas including a dopant atom of the second conductivity type concurrently with, or alternately with, the at least one semiconductor precursor gas and the at least one etchant gas. If the second conductivity type is n-type, the dopant gas can be, for example, $PH_3$, $AsH_3$, $SbH_3$, or a combination thereof. If the second conductivity type is p-type, the dopant gas can be, for example, $B_2H_6$.

In another embodiment, the emitter contact region 64 and the collector contact region 66 can be deposited as intrinsic second semiconductor material portions by selective deposition of an intrinsic second semiconductor material, and can be subsequently doped by implanting dopants of the second conductivity type.

The emitter contact region 64 and the collector contact region 66 can have a concentration of dopants of the second conductivity type, for example, from $1.0 \times 10^{19}/cm^3$ to $3.0 \times 10^{21}/cm^3$, although lesser and greater dopant concentrations can also be employed. In one embodiment, the concentration of dopants of the second conductivity type in the emitter contact region 64 and the collector contact region 66 can be greater than the net dopant concentration of dopants of the second conductivity type in the emitter region 34 and the collector region 36.

In one embodiment, the entirety of the base region 32, the emitter region 34, and the collector region 36 can be single crystalline. In one embodiment, the selective deposition of the second semiconductor material can be effected by performing selective epitaxy of the second semiconductor material. The second semiconductor material deposited in the emitter contact region 64 can be epitaxially aligned to the first semiconductor material in the emitter region 34, and the second semiconductor material deposited in the collector contact region 66 can be epitaxially aligned to the first semiconductor material in the collector region 36. In other words, the emitter contact region 64 can be epitaxially aligned to a single crystalline structure of the emitter region 34, and the collector contact region 66 can be epitaxially aligned to a single crystalline structure of the collector region 36. In this case, the entirety of the base region 32, the emitter region 34, the collector region 36, the emitter contact region 64, and the collector contact region 66 can be single crystalline and epitaxially aligned among one another.

Thus, the emitter contact region 64 including a portion of the second semiconductor material, having the second band gap that is greater than the first band gap, and having a doping of the second conductivity type is deposited directly on the emitter region 34. The collector contact region 66 including another portion of the second semiconductor material is deposited directly on the collector region 36 simultaneously with the deposition of the emitter contact region 64.

In one embodiment, the first semiconductor material can be germanium or a silicon germanium alloy having a first percentage of silicon, and the second semiconductor material can be silicon or a silicon germanium alloy having a second percentage of silicon that is greater than the first percentage. In another embodiment, the first semiconductor material can be single crystalline germanium or a single crystalline silicon germanium alloy having a first percentage of silicon, and the second semiconductor material can be single crystalline silicon or a single crystalline silicon germanium alloy having a second percentage of silicon that is greater than the first percentage. In yet another embodiment, the first semiconductor material can be single crystalline or polycrystalline germanium or a single crystalline or polycrystalline silicon germanium alloy having a first percentage of silicon, and the second semiconductor material can be polycrystalline silicon or a polycrystalline silicon germanium alloy having a second percentage of silicon that is greater than the first percentage.

In one embodiment, the dielectric spacer 70 is in contact with the base region 32, the emitter region 34, the emitter contact region 64, a collector region 36 that contacts the base region 32, and a collector contact region 66. In another embodiment, the dielectric spacer 70 is in contact with the emitter region 34, the emitter contact 64, a collector region 36 that contacts the base region 32, and a collector contact region 66. This is the case in which the lateral straggle of the implanted ions and the post-implantation diffusion of the implanted ions result in the emitter-base interface and the collector-base interface to be located under the extrinsic base region 52 and not under the dielectric spacer 70. In this case, the spacer 70 does not contact the base region 32.

Figure 6:
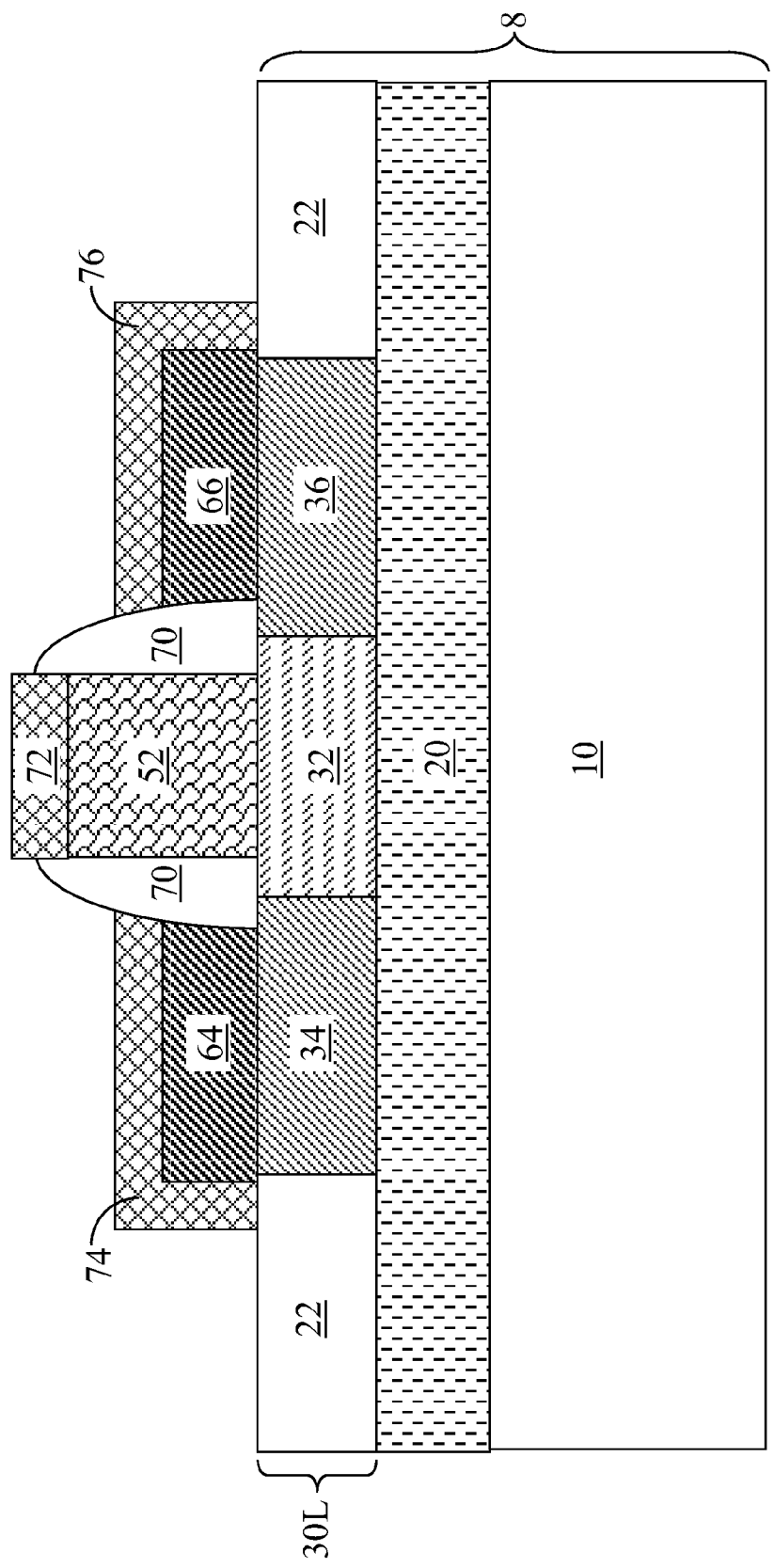
FIG. 6 is a vertical cross-sectional view of the exemplary semiconductor structure after formation of metal semiconductor alloy regions according to an embodiment of the present disclosure.

Referring to FIG. 6, metal semiconductor alloy regions can be optionally formed. In one embodiment, the dielectric cap 59 is removed selective to the dielectric materials of the dielectric spacer 70 and the shallow trench isolation structure 22 and the second semiconductor material of the emitter contact region 64 and the collector contact region 66. For example, if the dielectric cap 59 includes silicon nitride, and the shallow trench isolation structure 22 and the dielectric spacer 70 includes silicon oxide, a wet etch employing hot phosphoric acid can be employed to remove the dielectric cap 59 selective to the dielectric materials of the dielectric spacer 70 and the shallow trench isolation structure 22 and the second semiconductor material of the emitter contact region 64 and the collector contact region 66.

The metal semiconductor alloy regions can be subsequently formed, for example, by depositing a metal layer, inducing formation of the metal semiconductor alloy regions during an anneal at an elevated temperature, and subsequently removing unreacted portions of the metal layer selective to the metal semiconductor alloy regions. If the second semiconductor material and/or the extrinsic base semiconductor material include silicon and/or germanium, the various metal semiconductor alloy regions can contain a metal silicide, a metal germanide, and/or a metal germano-silicide. The various metal semiconductor alloy regions can include, for example, an emitter-side metal semiconductor alloy region 74, a collector-side metal semiconductor alloy region 76, and a base-side metal semiconductor alloy region 72.

Figure 7:
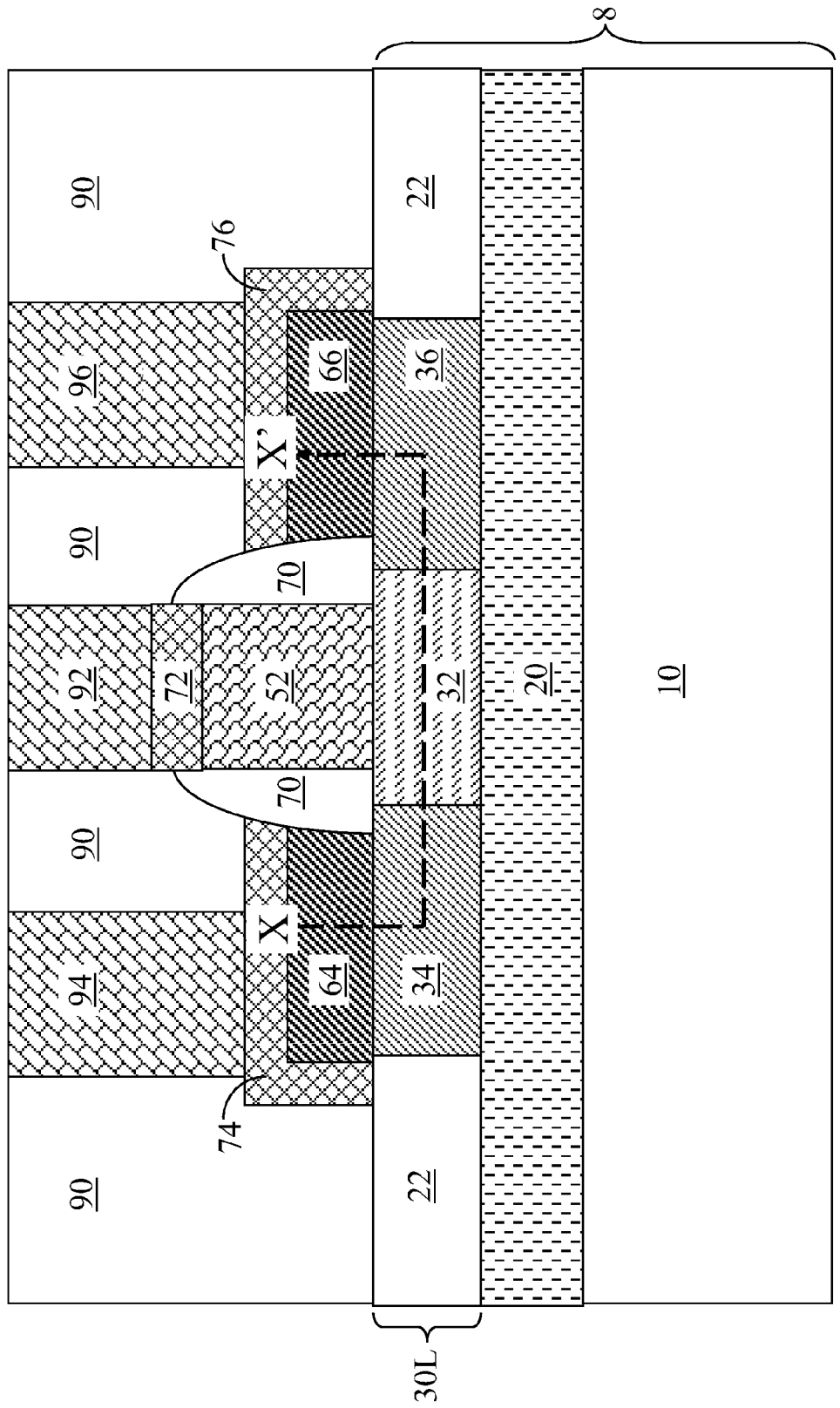
FIG. 7 is a vertical cross-sectional view of the exemplary semiconductor structure after formation of a contact-level dielectric layer and contact via structures according to an embodiment of the present disclosure.

Referring to FIG. 7, a contact-level dielectric material layer 90 can be deposited and various contact via structures can be formed to provide electrical contact to the emitter-side metal semiconductor alloy region 74 (or the emitter contact region 64 if an emitter-side metal semiconductor alloy region is not present), a collector-side metal semiconductor alloy region 76 (or the collector contact region 66 if a collector-side metal semiconductor alloy region is not present), and a base-side metal semiconductor alloy region 72 (or the extrinsic base region 52 if a base-side metal semiconductor alloy region is not present). The contact-level dielectric material layer 90 can include undoped silicate glass (i.e., silicon oxide), doped silicate glass, organosilicate glass, or any other dielectric material known in the art that can be employed for forming interconnect structures. The various contact via structures can include an emitter-side contact via structure 94, a base-side contact via structure 92, and a collector-side contact via structure 96.

Figure 8:
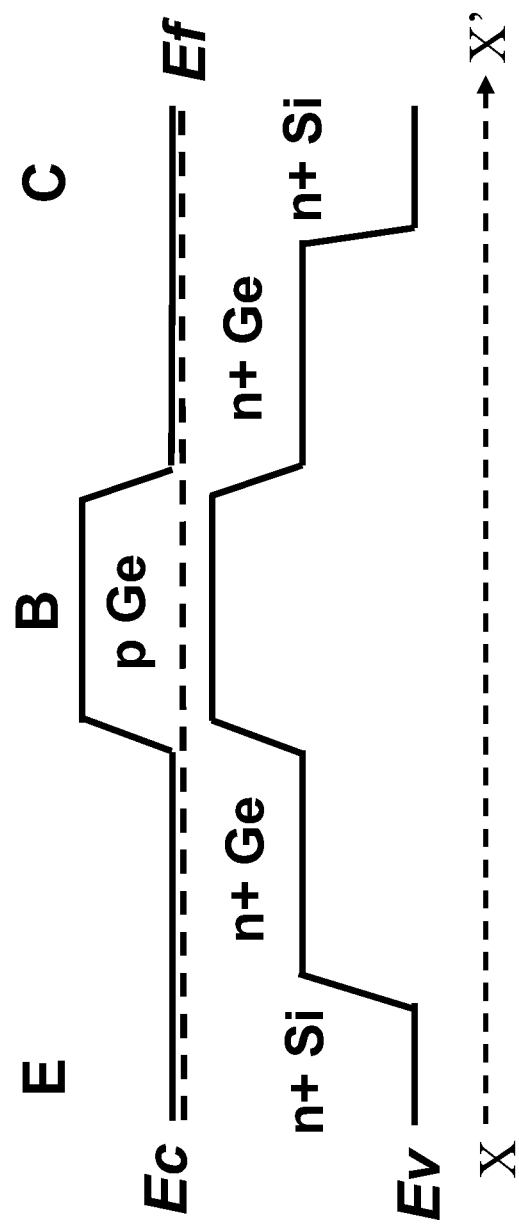
FIG. 8 is a band diagram of an NPN transistor according to an embodiment of the present disclosure.

Referring to FIG. 8, a band diagram of an NPN transistor according to an embodiment of the present disclosure is shown along the direction X-X' in FIG. 7 for an exemplary case in which the first semiconductor material is single crystalline germanium and the second semiconductor material is single crystalline silicon. The material junction between the n-doped germanium in the emitter region 34 and the n-doped silicon material of the emitter contact region 64 is physically offset, i.e., spaced, from the p-n junction between the n-doped germanium in the emitter region 34 and the p-doped germanium in the base region 32. The material junction, which is a heterojunction, between the n-doped germanium in the emitter region 34 and the n-doped silicon material of the emitter contact region 64 provides a greater current gain than a bipolar transistor that does not include a heterojunction. However, because the lattice constant of the n-doped germanium in the emitter region 34 is matched to the lattice constant of the p-doped germanium in the base region around the p-n junction, there is no strain around the p-n junction, and consequently, the density of dislocation is minimized. Thus, a factor that reduces current gain in conventional NPN heterojunction bipolar transistor is eliminated in the bipolar transistor structure according to an embodiment of the present disclosure.

Figure 9:
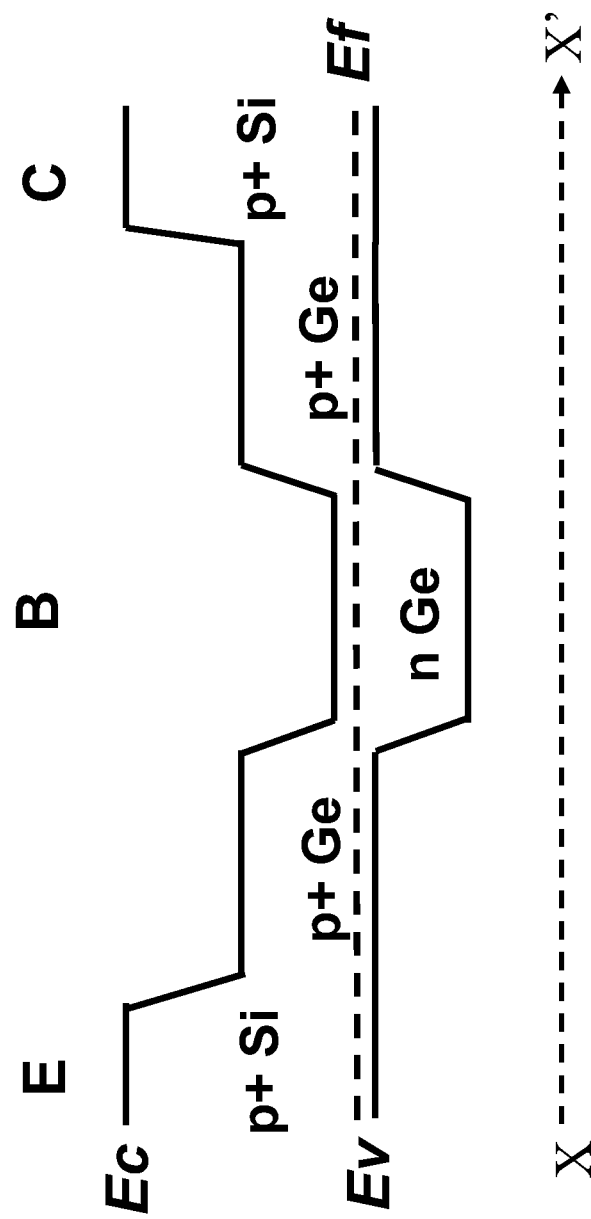
FIG. 9 is a band diagram of a PNP transistor according to an embodiment of the present disclosure.

Referring to FIG. 9, a band diagram of a PNP transistor according to an embodiment of the present disclosure is shown along the direction X-X' for an exemplary case in which the first semiconductor material is single crystalline germanium and the second semiconductor material is single crystalline silicon. The material junction between the p-doped germanium in the emitter region 34 and the p-doped silicon material of the emitter contact region 64 is physically offset, i.e., spaced, from the p-n junction between the p-doped germanium in the emitter region 34 and the n-doped germanium in the base region 32. The material junction, which is a heterojunction, between the p-doped germanium in the emitter region 34 and the p-doped silicon material of the emitter contact region 64 provides a greater current gain than a bipolar transistor that does not include a heterojunction. However, because the lattice constant of the p-doped germanium in the emitter region 34 is matched to the lattice constant of the n-doped germanium in the base region around the p-n junction, there is no strain around the p-n junction, and consequently, the density of dislocation is minimized. Thus, a factor that reduces current gain in conventional PNP heterojunction bipolar transistor is eliminated in the bipolar transistor structure according to an embodiment of the present disclosure.

Figure 10:
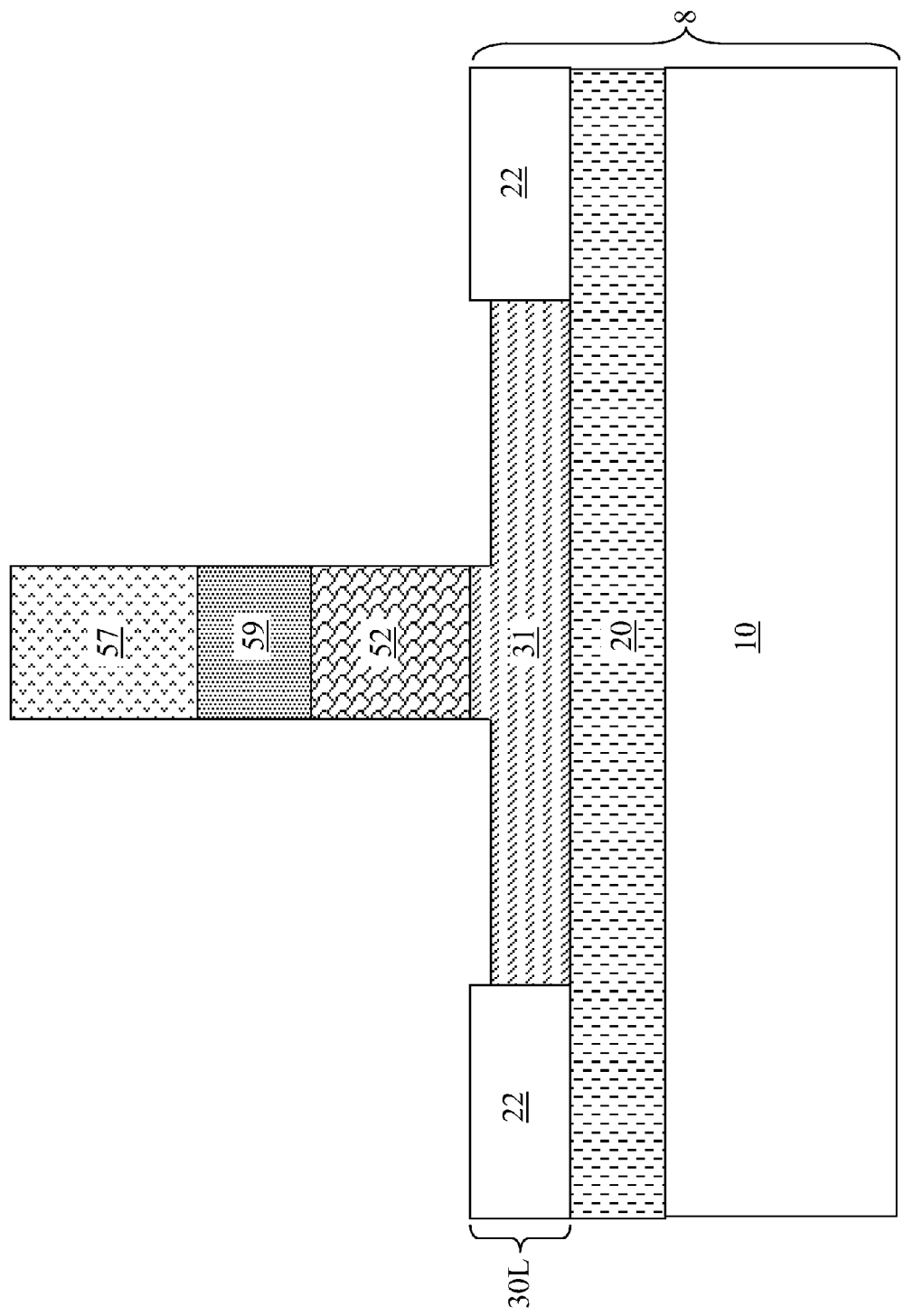
FIG. 10 is a vertical cross-sectional view of a variation of the exemplary semiconductor structure at a processing step corresponding to FIG. 3.

Referring to FIG. 10, a variation of the exemplary semiconductor structure at a processing step corresponding to FIG. 3 is illustrated. In this variation, the top surfaces of the top semiconductor portion 31 can be vertically recessed relative to the interface between the extrinsic base region 52 and an underlying region of the top semiconductor layer 31.

Figure 11:
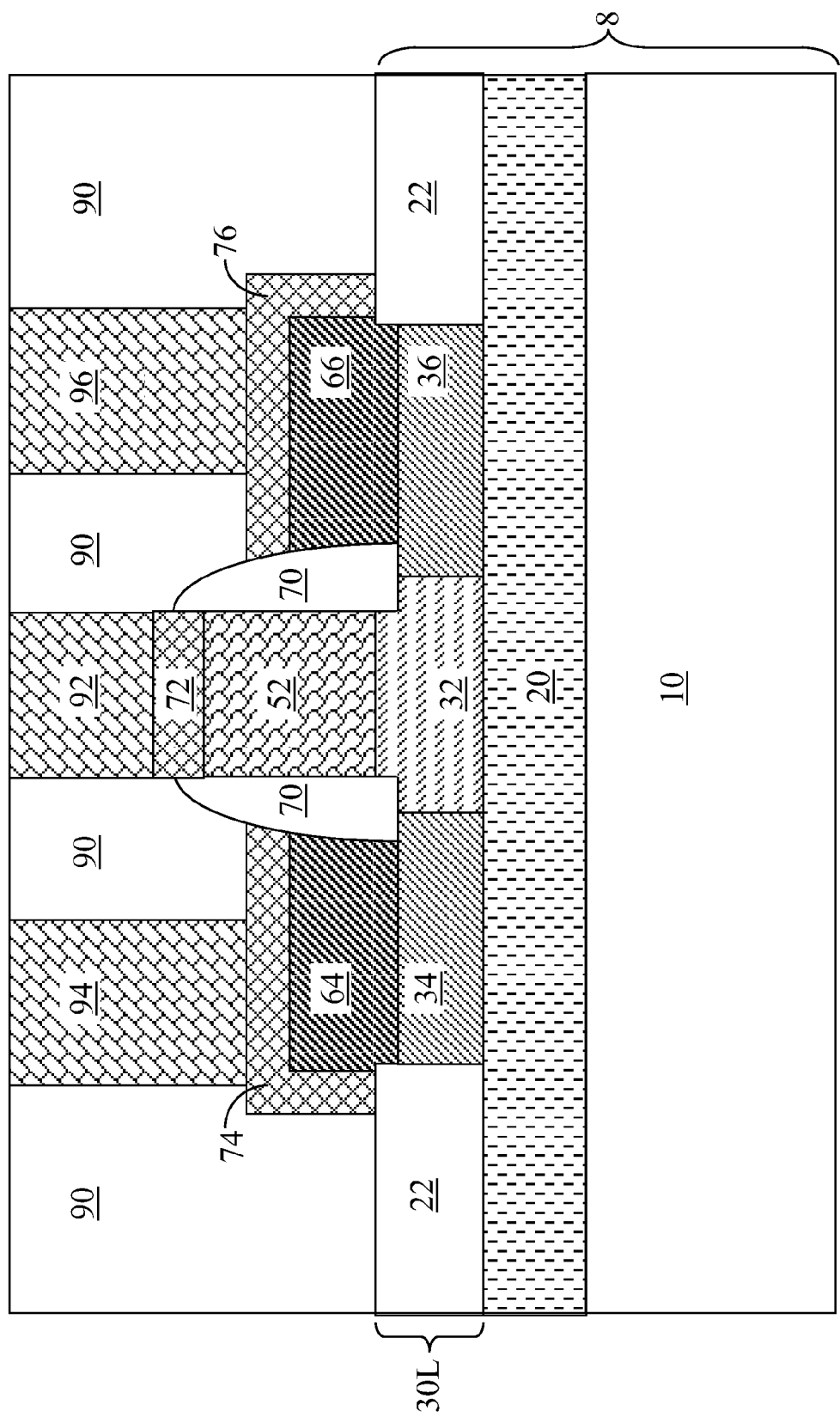
FIG. 11 is a vertical cross-sectional view of the variation of the exemplary semiconductor structure at a processing step corresponding to FIG. 7.

Subsequently, the processing steps of FIGS. 4-6 are performed. Referring to FIG. 11, the variation of the exemplary semiconductor structure at a processing step corresponding to FIG. 7 is shown. The entirety of the top surface of the emitter region 34 can be substantially coplanar with a top surface of the base region 32 in contact with the dielectric spacer 70. Likewise, the entirety of the top surface of the collector region 36 can be substantially coplanar with another top surface of the base region 32 in contact with the dielectric spacer 70. Then interface between the base region 32 and the extrinsic base region 52, which is the topmost surface of the base region 32, is located above the plane of the top surface of the emitter region 34 and the collector region 36.

In one embodiment, a semiconductor-on-insulator (SOI) lateral bipolar transistor having an emitter region 34, a base region 32, and a collector region 36 is provided. The emitter region 34, the base region 32, and the collector region 36 can be formed in the same semiconductor material layer including a first semiconductor material and located on the buried insulator layer 20. The emitter region 34 is contacted by an emitter-contact region 64 including a second semiconductor material that has a greater band gap than the first semiconductor material. The emitter-contact region 64 is doped with the same doping type as the emitter region 34, i.e., the second conductivity type.

As long as the charge carrier diffusion length in the emitter region 34 is greater than the distance between the p-n junction between the base region 32 and the emitter region 34 and the interface between emitter region 34 and the emitter contact region 62, the greater band gap of the emitter contact region 64 suppresses the base current and leads to a large current gain. The device of embodiments of the present disclosure functions satisfactorily for emitter regions of submicron dimensions. For example, the charge carrier diffusion length for a dopant concentration of $10^{18}/cm^3$ is on the order of 30 µm in silicon or germanium, and the charge carrier diffusion length for a dopant concentration of $10^{20}/cm^3$ is about 0.5 µm in silicon or germanium. In one embodiment, the emitter region 34 and the collector region 36 can have the same net dopant concentration. In this case, the emitter-collector symmetry makes such a device operate fast without any base pushout. Such a device is suitable for operation in forward-and-reverse active modes.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure including a bipolar junction transistor (BJT), said method comprising:
   providing a substrate including a semiconductor portion comprising a first semiconductor material having a first band gap and having a doping of a first conductivity type;
   converting a region of said semiconductor portion into an emitter region by introducing dopants of a second conductivity type that is the opposite of said first conductivity type into said region of said semiconductor portion, wherein a remaining region of said semiconductor portion constitutes a base region that laterally contacts said emitter region;
   converting another region of said semiconductor portion into a collector portion by introducing dopants of said second conductivity type into said another region of said semiconductor portion simultaneously with said conversion of said region into said emitter region, wherein said collector region laterally contacts said base region upon formation; and
   depositing an emitter contact region comprising a portion of a second semiconductor material having a second band gap that is greater than said first band gap and having a doping of said second conductivity type directly on said emitter region.

2. The method of claim 1, further comprising forming an extrinsic base region on a portion of a top surface of said semiconductor portion.

3. The method of claim 2, further comprising forming a dielectric spacer on sidewalls of said extrinsic base region and on said semiconductor portion.

4. The method of claim 3, further comprising selectively depositing said second semiconductor material on a surface of said emitter region, while said second semiconductor material does not grow from surfaces of said dielectric spacer.

5. The method of claim 4, wherein said selective deposition of said second semiconductor material is effected by performing selective epitaxy of said second semiconductor material, wherein said emitter contact region is epitaxially aligned to a single crystalline structure of said emitter region.

6. The method of claim 2, wherein said extrinsic base region is formed by:
   depositing an extrinsic base layer comprising an extrinsic base semiconductor material having a doping of said first conductivity type on said semiconductor portion; and
   patterning said extrinsic base layer by an etch, wherein a remaining portion of said extrinsic base layer constitutes said extrinsic base region.

7. The method of claim 1, wherein said first semiconductor material is single crystalline germanium or a single crystalline silicon-germanium alloy, and said second semiconductor material is single crystalline silicon.

8. The method of claim 1, further comprising depositing a collector contact region comprising another portion of said second semiconductor material directly on said collector region simultaneously with said deposition of said emitter contact region.

9. The method of claim 1, wherein said substrate is provided as a semiconductor-on-insulator (SOI) substrate including a handle substrate, a buried insulator layer contacting a top surface of said handle substrate, and a top semiconductor layer contacting a top surface of said buried insulator layer, and said semiconductor portion is formed by:
   patterning said top semiconductor layer with a shallow trench that extends at least to said top surface of said buried insulator layer, wherein a remaining portion of said top semiconductor layer is said semiconductor portion.

10. A method of forming a semiconductor structure including a bipolar junction transistor (BJT), said method comprising:
    providing a substrate including a semiconductor portion comprising a first semiconductor material having a first band gap and having a doping of a first conductivity type;
    converting a region of said semiconductor portion into an emitter region by introducing dopants of a second conductivity type that is the opposite of said first conductivity type into said region of said semiconductor portion, wherein a remaining region of said semiconductor portion constitutes a base region that laterally contacts said emitter region; and
    depositing an emitter contact region comprising a portion of a second semiconductor material having a second band gap that is greater than said first band gap and having a doping of said second conductivity type directly on said emitter region, wherein said first semiconductor material is single crystalline germanium or a single crystalline silicon-germanium alloy, and said second semiconductor material is single crystalline silicon.

11. The method of claim 10, further comprising forming an extrinsic base region on a portion of a top surface of said semiconductor portion.

12. The method of claim 11, further comprising forming a dielectric spacer on sidewalls of said extrinsic base region and on said semiconductor portion.

13. The method of claim 12, further comprising selectively depositing said second semiconductor material on a surface of said emitter region, while said second semiconductor material does not grow from surfaces of said dielectric spacer.

14. The method of claim 13, wherein said selective deposition of said second semiconductor material comprises selective epitaxy of said second semiconductor material, wherein said emitter contact region is epitaxially aligned to a single crystalline structure of said emitter region.

15. The method of claim 11, wherein said extrinsic base region is formed by:
    depositing an extrinsic base layer comprising an extrinsic base semiconductor material having a doping of said first conductivity type on said semiconductor portion; and
    patterning said extrinsic base layer by an etch, wherein a remaining portion of said extrinsic base layer constitutes said extrinsic base region.

16. The method of claim 10, further comprising converting another region of said semiconductor portion into a collector portion by introducing dopants of said second conductivity type into said another region of said semiconductor portion simultaneously with said conversion of said region into said emitter region, wherein said collector region laterally contacts said base region upon formation.

17. The method of claim 16, further comprising depositing a collector contact region comprising another portion of said second semiconductor material directly on said collector region simultaneously with said deposition of said emitter contact region.

18. The method of claim 10, wherein said substrate is provided as a semiconductor-on-insulator (SOI) substrate including a handle substrate, a buried insulator layer contacting a top surface of said handle substrate, and a top semiconductor layer contacting a top surface of said buried insulator layer, and said semiconductor portion is formed by:
    patterning said top semiconductor layer with a shallow trench that extends at least to said top surface of said buried insulator layer, wherein a remaining portion of said top semiconductor layer is said semiconductor portion.

19. A method of forming a semiconductor structure including a bipolar junction transistor (BJT), said method comprising:
    providing a substrate including a semiconductor portion comprising a first semiconductor material having a first band gap and having a doping of a first conductivity type;
    converting a region of said semiconductor portion into an emitter region by introducing dopants of a second conductivity type that is the opposite of said first conductivity type into said region of said semiconductor portion, wherein a remaining region of said semiconductor portion constitutes a base region that laterally contacts said emitter region;
    depositing an emitter contact region comprising a portion of a second semiconductor material having a second band gap that is greater than said first band gap and having a doping of said second conductivity type directly on said emitter region; and
    forming an extrinsic base region on a portion of a top surface of said semiconductor portion by:
        depositing an extrinsic base layer comprising an extrinsic base semiconductor material having a doping of said first conductivity type on said semiconductor portion; and
        patterning said extrinsic base layer by an etch, wherein a remaining portion of said extrinsic base layer constitutes said extrinsic base region.

20. The method of claim 19, wherein said first semiconductor material is single crystalline germanium or a single crystalline silicon-germanium alloy, and said second semiconductor material is single crystalline silicon.

* * * * *